United States Patent
Suesada et al.

[11] Patent Number: 5,986,614
[45] Date of Patent: Nov. 16, 1999

[54] ANTENNA DEVICE

[75] Inventors: Tsuyoshi Suesada, Shiga-Ken; Sejii Kanaba, Otsu; Teruhisa Tsuru, Kameoka, all of Japan

[73] Assignee: Murata Manufacturing Co., Ltd., Japan

[21] Appl. No.: 09/025,401

[22] Filed: Feb. 18, 1998

[30] Foreign Application Priority Data

Feb. 24, 1997 [JP] Japan .................................. 9-039157

[51] Int. Cl.⁶ .............................. H01Q 9/00; H01Q 1/38
[52] U.S. Cl. .................................. 343/752; 343/700 MS
[58] Field of Search .................................. 343/752, 895, 343/702, 700 MS; H01Q 9/00

[56] References Cited

U.S. PATENT DOCUMENTS

| | | | |
|---|---|---|---|
| 3,573,628 | 4/1971 | Cramer | 325/361 |
| 3,967,276 | 6/1976 | Goubau | 343/752 |
| 5,181,044 | 1/1993 | Matsumoto et al. | 343/752 |

FOREIGN PATENT DOCUMENTS

| | | | |
|---|---|---|---|
| 0 749 214 A2 | 12/1996 | European Pat. Off. | H04B 1/50 |
| 0749214 | 12/1996 | European Pat. Off. | H04B 1/50 |
| 7400419 | 11/1974 | Germany . | |

*Primary Examiner*—Haonganh Le
*Assistant Examiner*—Shih-chao Chen
*Attorney, Agent, or Firm*—Ostrolenk, Faber, Gerb & Soffen, LLP

[57] ABSTRACT

The invention provides a compact and light-weight antenna device for use in a mobile telephone requiring a wide frequency band. An antenna device 10 includes a first printed circuit board 11 and a ground plate 12 generally arranged in parallel, and a second printed circuit board 13 arranged vertically between the first printed circuit board 11 and the ground plate 12, and an antenna body 14 mounted on the second printed circuit board 13. A capacitive load conductor 15 is mounted on the first printed circuit board 11, and a surface electrode 16, a ground electrode 17 and a transmission line 18 are mounted on the second printed circuit board 13. The antenna body 14 is provided with terminals 19 and 21 connected to both ends of a conductor (not shown).

8 Claims, 8 Drawing Sheets

ANTENNA DEVICE

BACKGROUND OF THE INVENTION

1. Field of the Invention

The present invention relates to an antenna device and, more particularly, to an antenna device for use in a mobile telephone operating within a frequency band from 800 MHz–960 MHz.

2. Related Art of the Invention

A mounting position for a mobile telephone antenna on a car is selected from a variety of positions considering available installation points on a car body and assuring clear vision of a driver. For example, rooftop, roofside, and trunk grid are selected as a mounting position. A wire-like antenna to be mounted there is typically a monopole antenna as shown in FIG. 12. The monopole antenna 50 is an antenna element 52 of a ¼-wave length (¼ λ) mounted on a ground plate 51 such as a roof of a car. The antenna element 52 has one end connected to a feeder section 53 connected to a power source V with the other end being an open end 54.

In case of the above conventional monopole antenna, the antenna element of ¼-wave length is 8 cm–9 cm in a mobile telephone operating in a frequency range of 810 MHz–956 MHz, for example. With such an antenna, the following problems are raised: (1) the antenna degrades the aesthetic appearance of the car; (2) the antenna results in an increased air resistance of the car body; (3) the mounting positions available are limited; and (4) the types of car permitting mounting are limited.

SUMMARY OF THE INVENTION

The present invention has been developed to resolve the above problems, and it is an object of the present invention to provide a compact and light-weight antenna device which is for use in a mobile telephone required to operate in a wide range of frequency.

The present invention provides an antenna device, comprising; a first printed circuit board having a capacitive load conductor, a second printed circuit board having a ground electrode and a transmission line one end of which is connected to a power source, a ground plate connected to said ground electrode, at least one antenna body comprising a conductor having a pair of terminals on both ends, said first printed circuit board being arranged substantially in parallel with said ground plate, said second printed circuit board being arranged between said first printed circuit board and said ground plate such that said second printed circuit board is substantially vertical to both of said first printed circuit board and said ground plate, and at least one of said antenna bodies being a first antenna body constituting a feeding element, in which one of said terminals is electrically connected to said transmission line of said second printed circuit board and the other terminal is electrically connected to said capacitive load conductor of said first printed circuit board.

Since one terminal of the first antenna body is electrically connected to the power source via the transmission line on the second printed circuit board and the other terminal is electrically connected to the capacitive load conductor of the first printed circuit board, only the capacitance component c of the conductor of the first antenna body increases with inductance component L and resistance component R unchanged. Since the value of Q $(=(L/C)^{1/2}/R)$ of the antenna device is thus lowered, the bandwidth of the antenna device is broadened, enabling one single compact antenna device, ¼ as low as or lower than the height of the conventional antenna, to perform transmission and reception. As a result, the mobile telephone having an antenna device requiring a broad frequency band is made compact.

In the above antenna device, at least one of said antenna bodies other than said first antenna body may be a second antenna body, in which one of said terminals is electrically connected to said ground electrode and the other of said terminal is electrically connected to said capacitive load conductor of said first printed circuit board to which the other terminal of said feeding element is connected.

Since the first antenna body and the second antenna body are connected in series via the capacitive load conductor between the transmission line with its one end connected to the power source and the ground terminal, the input impedance of the antenna device is finely adjusted by adjusting the ratio of the number of windings of the conductor on the first antenna body connected between -the transmission line and the capacitive load conductor to the number of windings of the second antenna body connected between the capacitive load conductor and the ground terminal. The input impedance of the antenna device is therefore easily set to match the characteristic impedance of an radio apparatus to which the antenna device is connected.

In the above antenna device, said first printed circuit board may have at least two capacitive load conductors, and at least one of said antenna bodies other than said first and second antenna bodies may be a third antenna body constituting a non-feeding element, in which one of said terminals is electrically connected to said ground electrode of said second printed circuit board and the other of said terminals is electrically connected to one of said capacitive load conductors different from the capacitive load conductor to which the other terminal of said feeding element is connected.

By the above structure, a strong electric field is generated in the vicinity of the first antenna body constituting the feeding element and in response to the electric field, and currents flow through the conductors of the antenna bodies constituting the non-feeding elements.

Since the currents cause the third antenna bodies constituting the non-feeding elements and the first antenna body constituting the feeding element to concurrently resonate, the antenna device results in a plurality of resonant frequencies through the feeding to the single antenna body, and a wide-band design is thus implemented in the antenna device.

In the above antenna device, said antenna body may be a chip antenna body comprising a base made of at least one of a dielectric material and a magnetic material, at least one conductor provided at least on an external surface of said base or in internal area of said base, and a pair of terminals provided on the external surface of said base and connected to both ends of said conductor.

Since the antenna body is made of the base manufactured of at least a dielectric material or a magnetic material, velocity of propagation is slowed, wavelength is shortened, and let $\epsilon$, represent dielectric constant of the base, effective transmission line length is multiplied by, $\epsilon^{1/2}$, thereby becoming longer than the effective transmission line length of conventional wire-like antenna. Along with this, the area of current distribution is expanded, increasing quantity of radiated radio wave and enhancing gain of the antenna device.

In the above antenna device, said antenna body may comprise a meandering-patterned electrode or a spiral-patterned electrode provided on said second printed circuit board.

By the above structure, the antenna body provided on the second printed circuit board can be formed concurrently with the surface electrode, the ground electrode and the transmission line. No separate manufacturing steps are required for forming the antenna body, and manufacturing process is shortened and production cost involved is thus reduced.

PREFERRED EMBODIMENT OF THE PRESENT INVENTION

Other features and advantages of the present invention will become apparent from the following description of the invention which refers; to the accompanying drawings.

Figure 1:
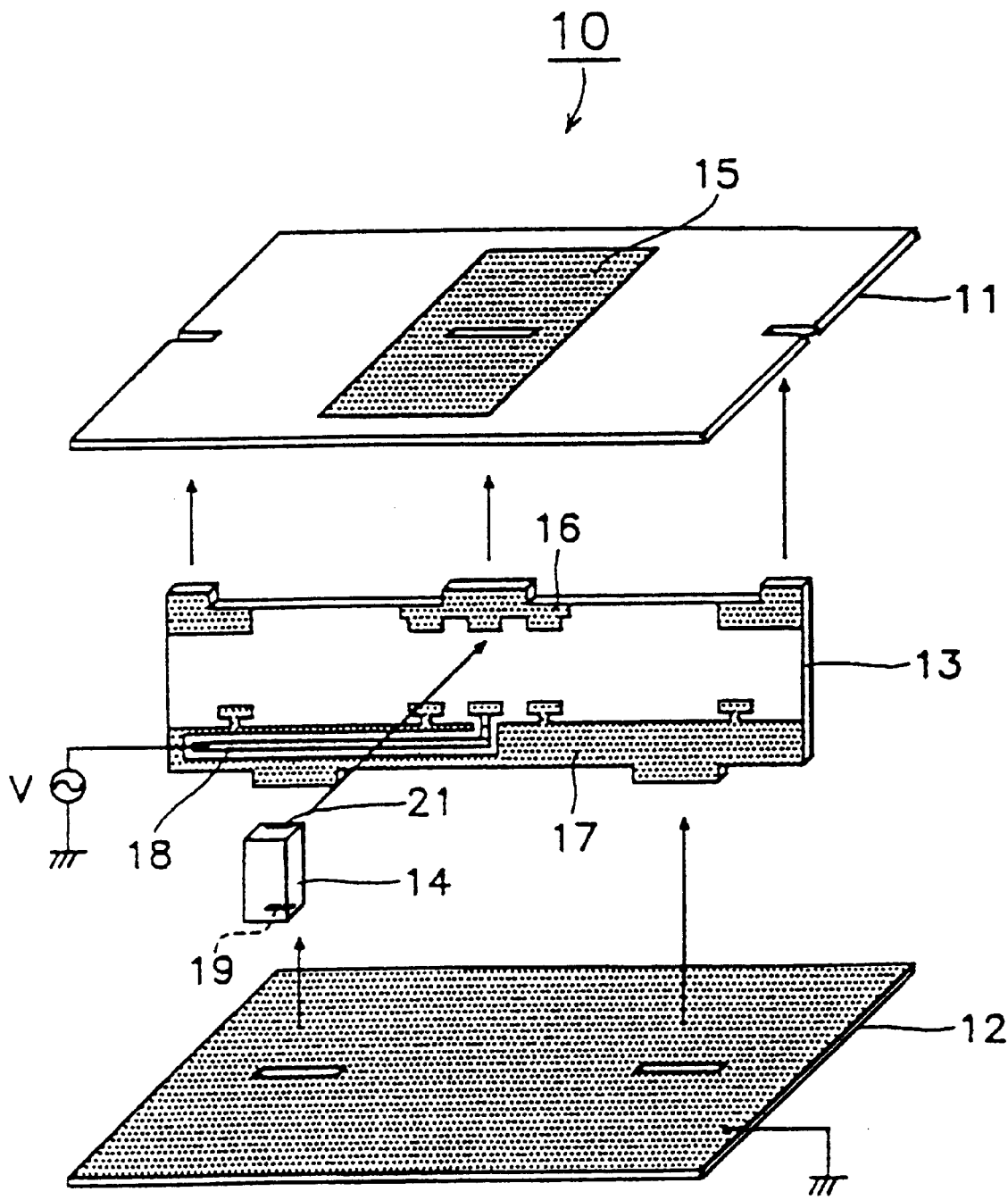
FIG. 1 is an exploded perspective view of the first embodiment of the antenna device of the present invention.

FIG. 1 is an exploded perspective view showing a first embodiment of the antenna device of the present invention. The antenna device 10 comprises a first printed circuit board 11 and a ground plate 12 arranged substantially in parallel with the first printed circuit board 11, a second printed circuit board 13 arranged between the first printed circuit board 11 and the ground plate 12 in such a manner that the second printed circuit board 13 is substantially vertical to both the first printed circuit board 11 and the ground plate 12, and a first antenna body 14 mounted on the second printed circuit board 13. The external dimensions of the antenna device 10 are 60 mm×50 mm×20 mm, for example.

A capacitive load conductor 15 is mounted on the first printed circuit board 11 and a surface electrode 16, a ground electrode 17 and a transmission line 18 are mounted on the second printed circuit board 13. A power source V is connected to one end of the transmission line 18 on the second printed circuit board 13. The surface electrode 16 on the second printed circuit board 13 is connected to the capacitive load conductor 15 on the first printed circuit board 11, and the ground electrode 17 is connected to the ground plate 12.

The first antenna body 14 is provided with terminals 19, 21 connected to both sides of a conductor (not shown). The first antenna body 14 is a feeding element connected to the surface electrode 16 of the second printed circuit board 13, with one terminal 19 electrically connected to the other end of the transmission line 18 on the second printed circuit board 13, and with the other terminal 21 electrically connected to the capacitive load conductor 15 on the first printed circuit board 11. In this setup, the first antenna body 14 as the feeding element is assembled on the second printed circuit board 13.

In the antenna device of the first embodiment, one terminal of the antenna body is electrically connected to the power source via the transmission line on the second printed circuit board, and the other terminal of the antenna body is electrically connected to the capacitive load conductor of the first printed circuit board, and only the capacitance component C of the conductor of the first antenna body increases with inductance component L and resistance component R unchanged. Since the value of Q $(=(L/C)^{1/2}/R)$ of the antenna device is thus lowered, the bandwidth of the antenna device is broadened, enabling one single compact antenna device, ¼ as low as or lower than the height of the conventional antenna, to perform transmission and reception.

Figure 2:
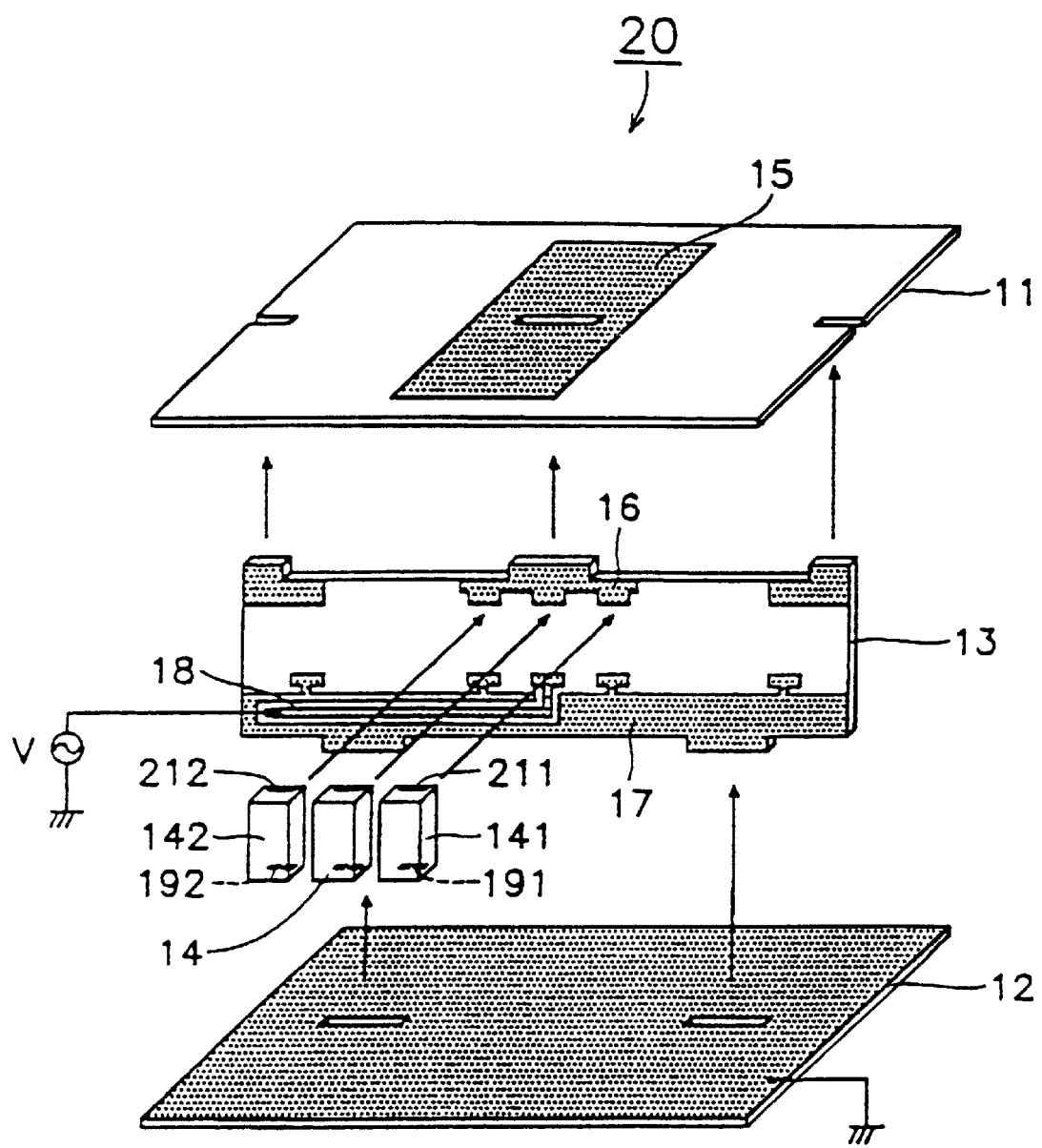
FIG. 2 is an exploded perspective view of the second embodiment of the antenna device of the present invention.

FIG. 2 is an exploded perspective view of a second embodiment of the antenna device of the present invention. In comparison with the antenna device 10, the antenna device 20 is different from the antenna device 10 in that the antenna device 20 comprises the first antenna body 14 with its terminal 19 electrically connected to the other end of the transmission line 18 of the second printed circuit board 13 and the other terminal 21 electrically connected to the capacitive load conductor 15 on the first printed circuit board 11 via the surface electrode 16 on the second printed circuit board 13, and two second antenna bodies 141 and 142 with their terminals 191 and 192 respectively electrically connected to ground terminals 17 on the second printed circuit board 13 and other terminals 211 and 212 respectively electrically connected to the capacitive load conductor 15 on the first printed circuit board 11 via the surface electrode 16 on the second printed circuit board 13.

Since, as described above, in the antenna device of the second embodiment, the first antenna body 14 and one of the second antenna bodies 141 and the first antenna body 14 and the other of the second antenna bodies 142 are connected in series via the capacitive load conductor 15 of the first printed circuit board 11, between the transmission line with its end connected to the power source and the ground terminal, the input impedance of the antenna device is finely adjusted by adjusting the ratio of the number of windings of the conductor on the first antenna body to the number of windings of the conductor of one of the second antenna bodies, and by adjusting the ratio of the number of windings of the conductor on the first antenna body to the number of windings of the conductor of the other of the second antenna bodies. The input impedance of the antenna device is therefore easily set to match the characteristic impedance of an radio apparatus to which the antenna device is connected.

Figure 3:
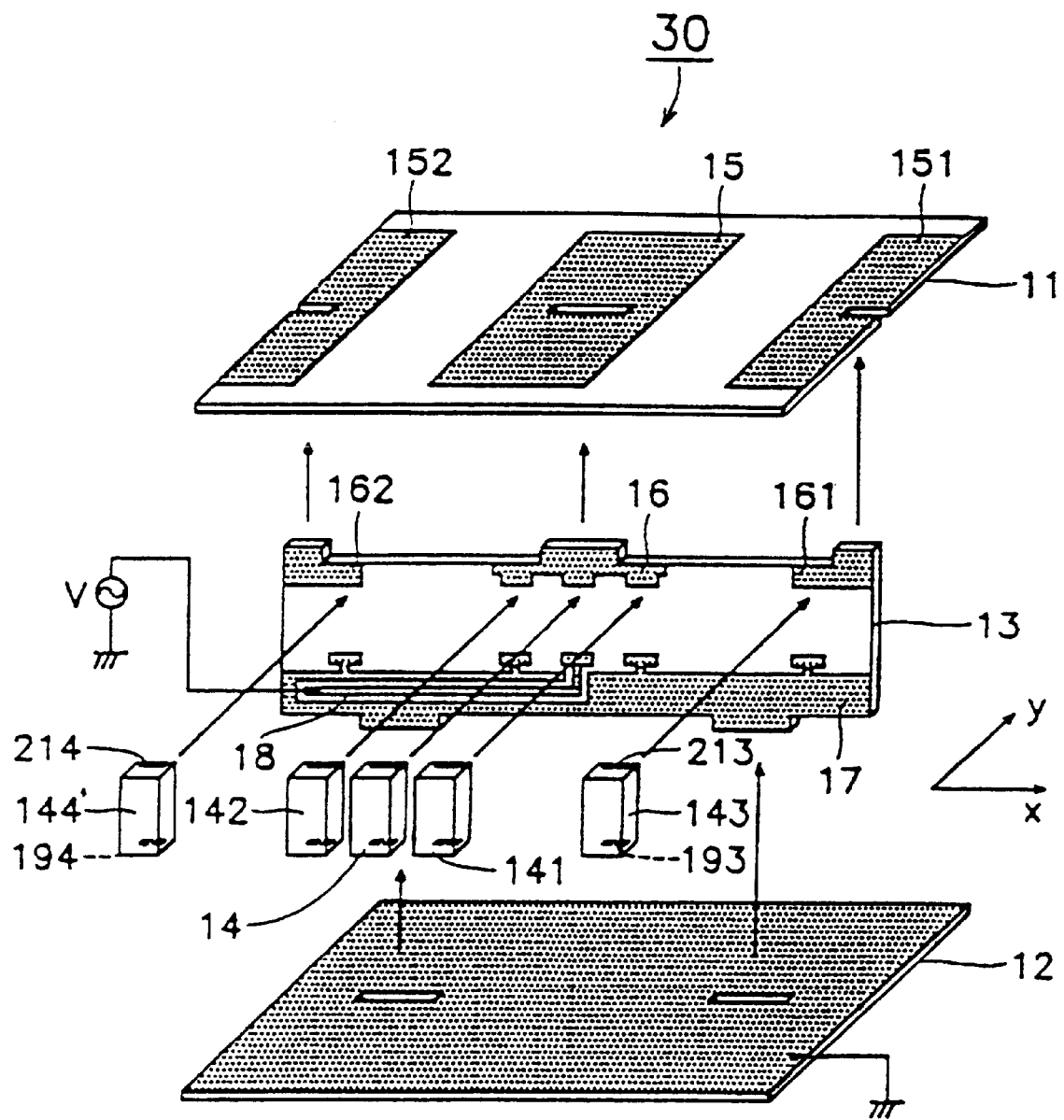
FIG. 3 is an exploded perspective view of the second embodiment of the antenna device of the present invention.

FIG. 3 is an exploded perspective view of a third embodiment of the antenna device of the present invention. In comparison with the antenna device 20, the antenna device 30 is different from the antenna device 20 in that the antenna device 30 comprises first—third capacitive load conductors 15, 151 and 152, and a non-feeding element constituted by two third antenna bodies 143 and 144 which have terminals 193 and 194 respectively electrically connected to ground terminals 17 on the second printed circuit board 13 and other terminals 213 and 214 respectively electrically connected to the second and third capacitive load conductor 151 and 152 on the first printed circuit board 11 via the surface electrodes 161 and 162 on the second printed circuit board 13.

Figure 4:
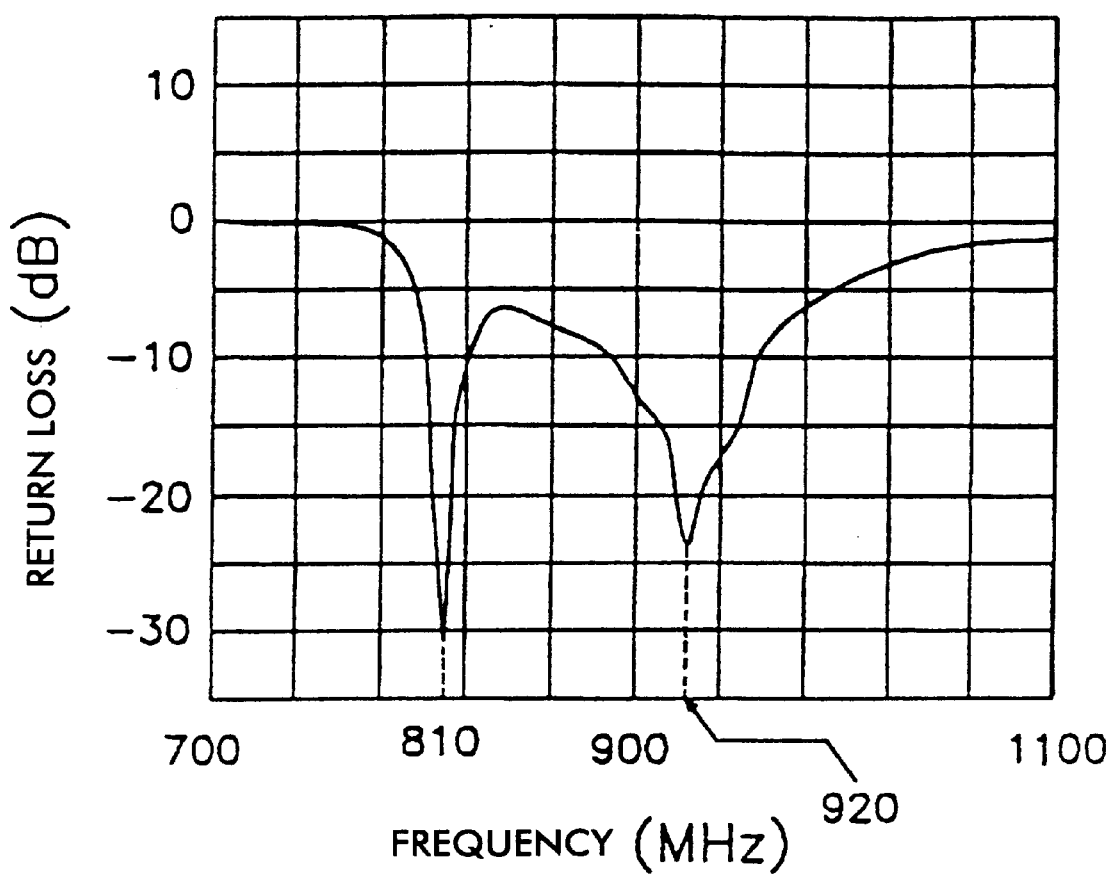
FIG. 4 is a graph showing the return loss in the antenna device of FIG. 3.

FIG. 4 shows the frequency characteristics with respect to reflection loss in the antenna device 30. As apparent from this figure, a reflection loss of −6 (dBd) is obtained in the mobile telephone band from 810 MHz–956 MHz and a wide-band feature thus results. Also as apparent from this figure, since the identical third antenna bodies are used for the two non-feeding elements, the antenna device has two resonant frequencies of 810 MHz and 920 MHz.

Figure 5:
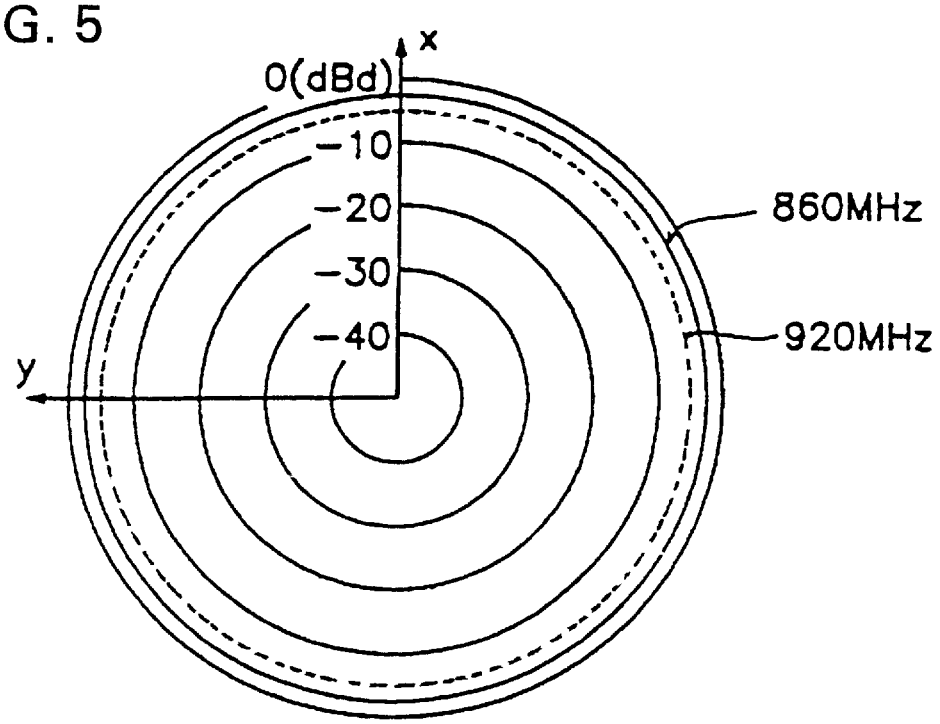
FIG. 5 is a diagram showing the horizontal directivity pattern of the antenna device of FIG. 3 on 860 MHz and 920 MHz.
Figure 8:
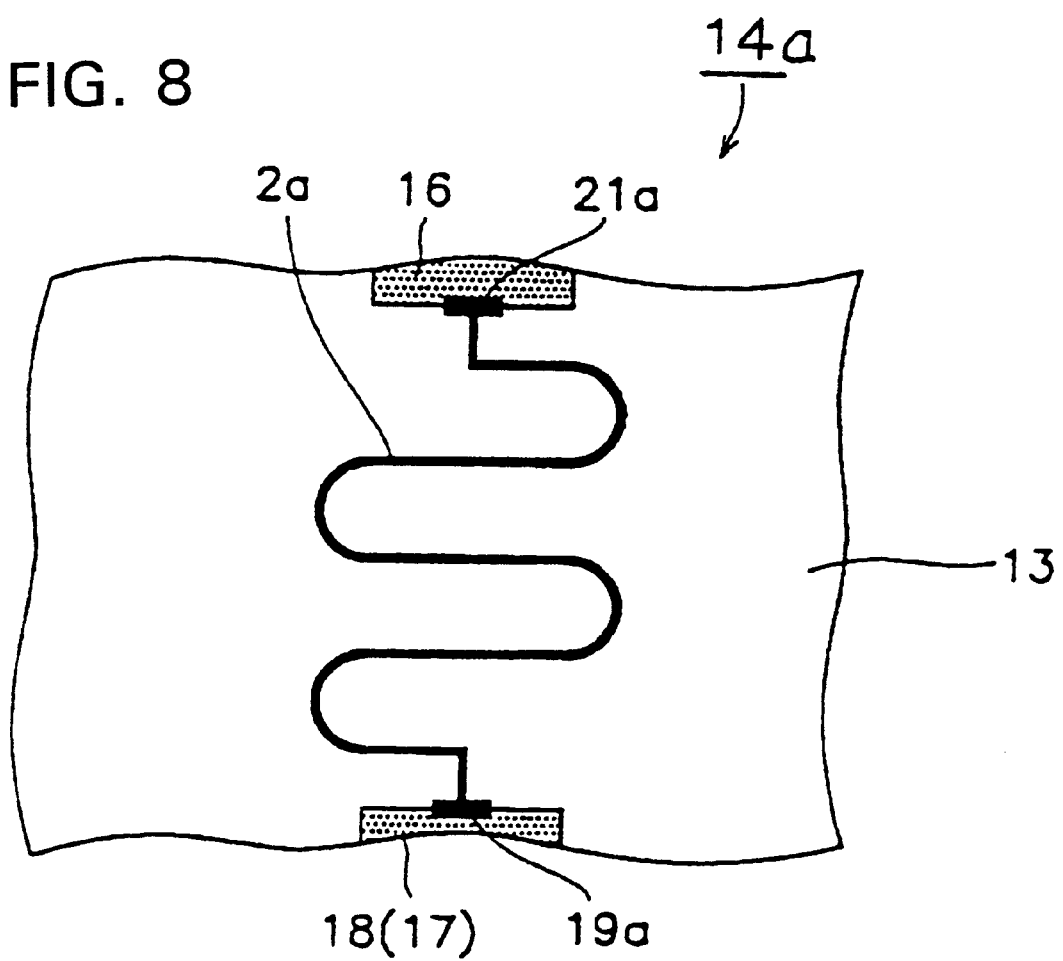
FIG. 8 is a top view showing another antenna body constituting the antenna devices shown in FIG. 1–FIG. 3.

FIG. 5 shows the horizontal directivity patterns of the antenna device 30 on 860 MHz and 920 MHz. In FIG. 8, a full line represents the one for 860 MHz and a broken line represents the one for 920 MHz. As apparent from this figure, the antenna device presents substantially uniform directivity around 360°, namely omnidirectional directivity.

Figure 6:
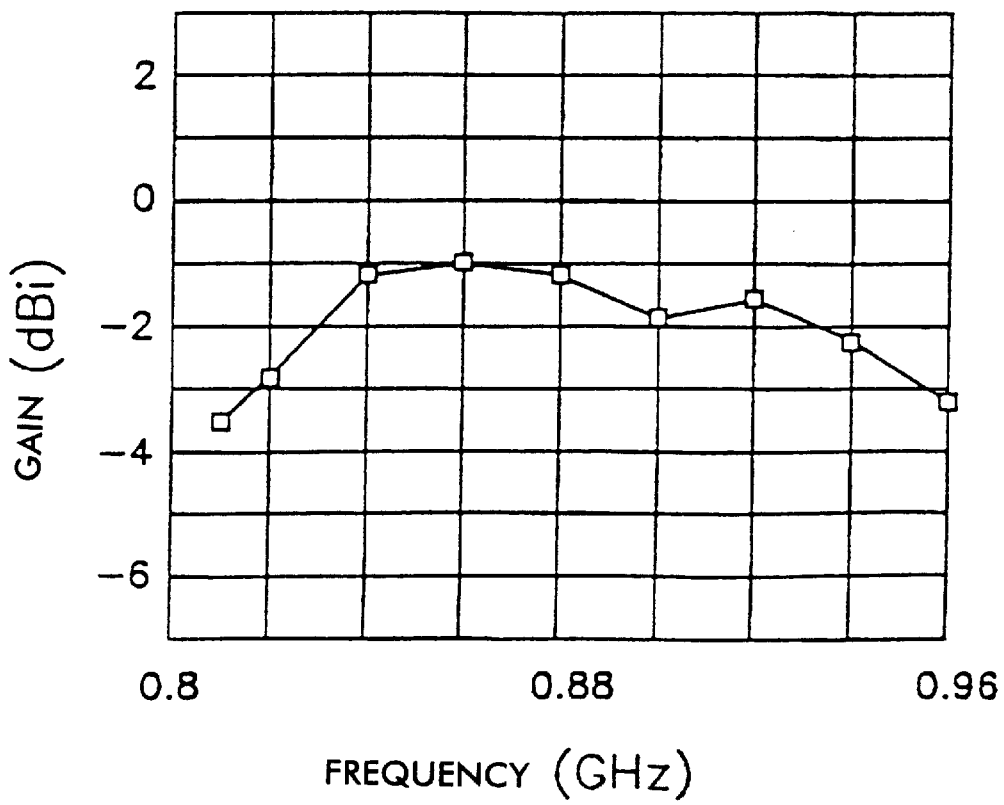
FIG. 6 is a diagram showing gain of the antenna device of FIG. 3.

FIG. 6 shows the frequency characteristics with respect to average gain in the antenna device 30. As seen from this figure, substantially uniform gain characteristics are obtained with gain of −4 (dBi)––1 (dBi) between 810 MHz–960 MHz.

In the antenna device of the third embodiment as described above, the first antenna body that constitutes the feeding element, connected to the surface electrode on the second printed circuit board, with one terminal electrically connected to the other end of the transmission line on the second printed circuit board and the other terminal electrically connected to the first capacitive load conductor on the first printed circuit board is arranged close to the two third antenna bodies that constitute non-feeding elements, connected to the surface electrode of the second printed circuit board, with terminals electrically connected to the ground electrode on the second printed circuit board and the other terminals electrically connected to the second and third capacitive load conductors on the first printed circuit board, and a strong electric field is generated in the vicinity of the first antenna body constituting the feeding element and in response to the electric field, currents are flown through the conductors of the two third antenna bodies constituting the non-feeding elements.

Since the currents cause the two third antenna bodies constituting the non-feeding elements and the first antenna body constituting the feeding element to concurrently resonate, the antenna device results in a plurality of resonant frequencies through the feeding to the single antenna body results, and a wide-band design is thus implemented in the antenna device.

Figure 7:
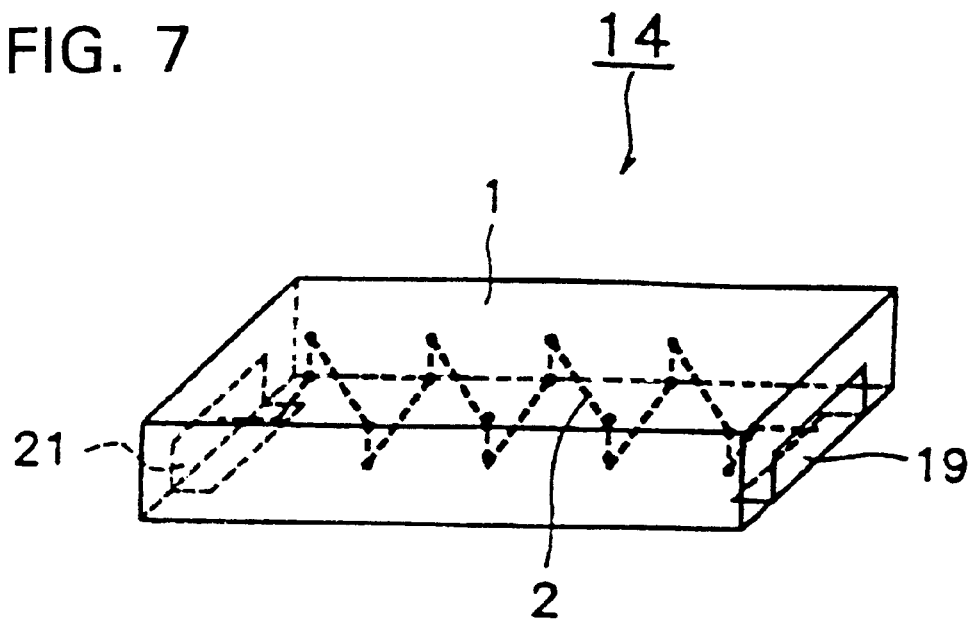
FIG. 7 is a perspective view showing the interior of the antenna body constituting the antenna devices shown in FIG. 1–FIG. 3.
Figure 9:
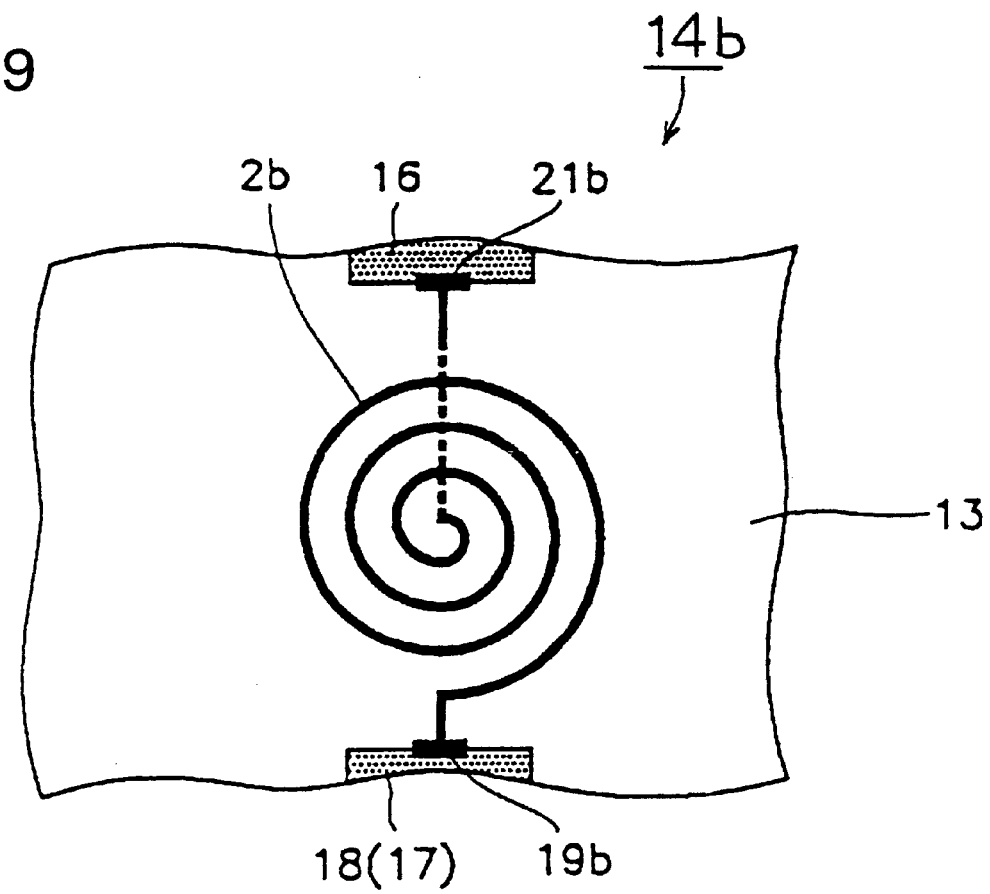
FIG. 9 is a top view showing yet another antenna body constituting the antenna devices shown in FIG. 1–FIG. 3.

FIGS. 7 through 9 show examples of the antenna bodies used in the antenna devices shown in FIGS. 1 through 3. The first antenna body 14 shown in FIG. 7 comprises a conductor 2 spiraling, in a rectangular parallelopiped base 1 containing barium oxide, aluminum oxide and silica as chief materials, in the direction of length of the base 1, and a pair of terminals 19 and 21 on both end surfaces of the base 1. One end of the conductor 2 is routed out of the one end surface of the base 1 and is connected to the one terminal 19 serving as a feeder terminal. The other end of the conductor 2 is routed out of the other end surface of the base 1 and is connected to the other terminal 21 serving as a free terminal. The base 1 is arranged to be rotated by 90° and vertical to the second printed circuit board 13.

The use of barium oxide, aluminum oxide and silica as chief materials for the rectangular parallelopiped base 1 slows velocity of propagation, shortening wavelength, and let $\epsilon$, represent dielectric constant of the base 1, effective transmission line length is multiplied by, $\epsilon^{1/2}$, thereby becoming longer than the effective transmission line length of conventional wire-like antenna. Along with this, the area of current distribution is expanded, increasing quantity of radiated radio wave and enhancing gain of the antenna device.

The antenna body 14a shown in FIG. 8 is constructed of a meandering conductor 2a and a pair of terminals 19a and 21a, formed on the second printed circuit board made of glass epoxy as its chief material. In the second printed circuit board 13, the one end of the meandering conductor 2a is connected to the one terminal 19a serving as the feeder terminal and the other end is connected to the other terminal 21a serving as the free terminal.

The antenna body 14b shown in FIG. 9 is constructed of a spiraling conductor 2b and a pair of terminals 19b and 21b, formed on the second printed circuit board 13 made of glass epoxy as its chief material. In the second printed circuit board 13, the one end of the meandering-patterned conductor 2b is connected to the one terminal 19b serving as the feeder terminal and the other end is connected to the other terminal 21b serving as the free terminal.

Since in the antenna bodies 14a and 14b shown in FIGS. 8 and 9, the meandering conductor 2a and the spiraling conductor 2b are formed concurrently with the surface electrode 15, ground electrode 16 and transmission line 17 on the second printed circuit board 13, no separate manufacturing steps are required for forming the antenna body, and manufacturing process is shortened and product, on cost involved is thus reduced.

Figure 10:
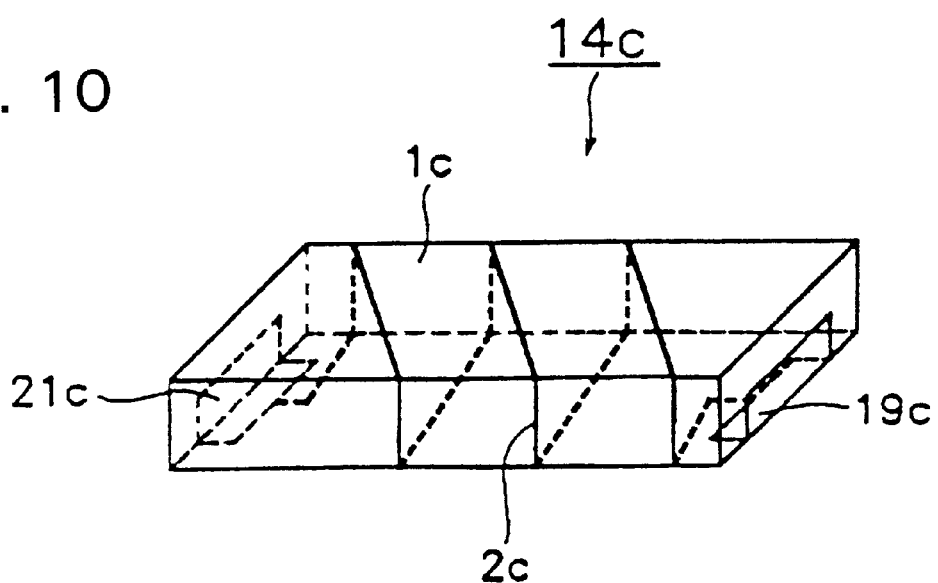
FIG. 10 is perspective view showing the modification of the antenna body of FIG. 7.
Figure 11:
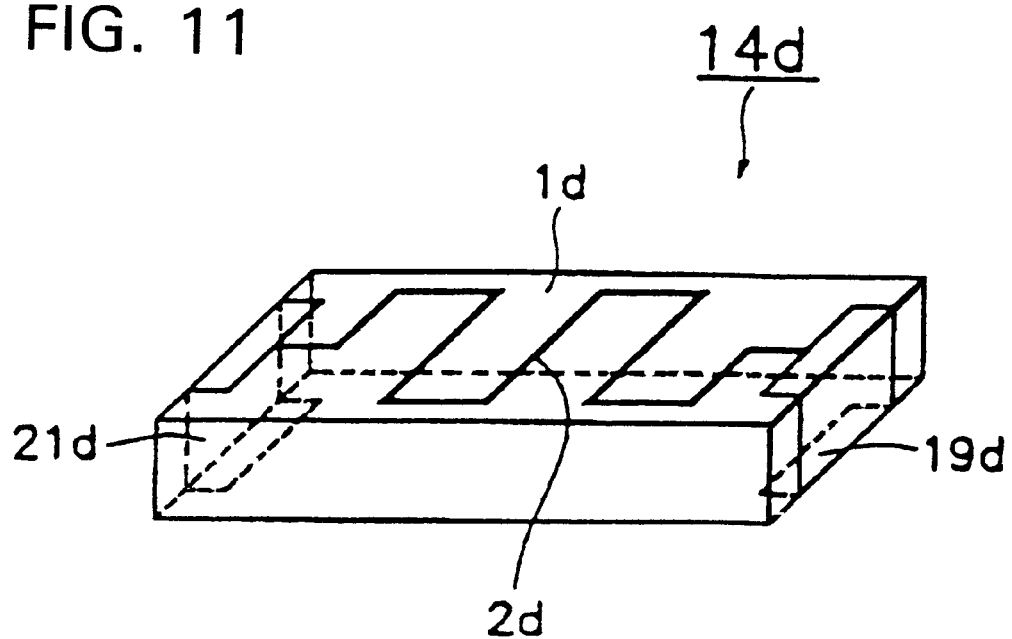
FIG. 11 is a perspective view showing another modification of the antenna body of FIG. 7.
Figure 12:
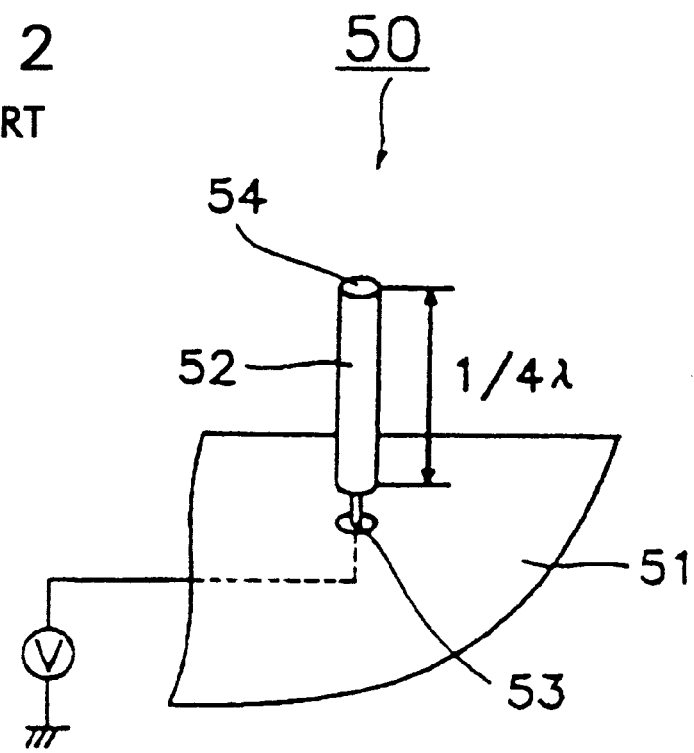
FIG. 12 is a diagram showing the conventional monopole antenna for use in a car.

FIG. 10 and FIG. 11 show modifications of the first antenna body 14 shown in FIG. 7. The antenna body 14c shown in FIG. 10 comprises a rectangular parallelopiped base 1c, a conductor 2c spirally wound around the surface of the base 1c in the direction of length of the base 1, and a pair of terminals 19c and 21c on the surface of the base 1c. One end of the conductor 2c is connected to one terminal 19c serving as a feeder terminal on the surface of the base 1c. The other end of the conductor 2c is connected to the other terminal 21c serving as a free terminal on the surface of the base 1c. Like the second antenna body 14 shown in FIG. 2, this antenna body 14, rotated by 90° to be vertical to the second printed circuit board 13, is mounted onto the second printed circuit board 13.

Since the conductor 2c is easily formed in a spiral pattern on the base 1c using screen printing technique, manufacturing process for the antenna body 14c is simplified.

The antenna body 14d shown in FIG. 11 comprises a meandering conductor 2d formed on the surface of a base 1d, and a pair of terminals 19d and 21d on the surface of the base 1d. One end of the conductor 2d is connected to one terminal 19d serving as a feeder terminal one the surface of the base 1d. The other end of the conductor 2d is connected to the other terminal 21d serving as a free terminal on the surface of the base 1d. Like the second antenna body 14 shown in FIG. 2, this antenna body 14, rotated by 90° to be vertical to the second printed circuit board 13, is mounted onto the second printed circuit board 13.

Since the meandering conductor 2d is formed on one principal surface of the base 1d only, a low profile design is introduced in the base 1, and the antenna body 11d is also low-profiled accordingly. The meandering conductor 2d may be formed within the base 1d.

While the invention has been particularly shown and described with reference to preferred embodiments thereof, it will be understood by those skilled man in the art that the forgoing and other changes in form and details may be made therein without departing from the spirit of the invention.

What is claimed is:

1. An antenna device, comprising;

a first printed circuit board having a capacitive load conductor, a second printed circuit board having a ground electrode and a transmission line, one end of which is connected to a power source, a ground plate connected to said ground electrode, at least one antenna body comprising a conductor having a pair of terminals on both ends, said first printed circuit board being arranged substantially in parallel with said ground plate, said second printed circuit board being arranged between said first printed circuit board and said ground plate such that said second printed circuit board is substantially perpendicular to both of said first printed circuit board and said ground plate, and said at least one antenna body being a first antenna body comprising a feeding element in which one of said terminals is electrically connected to said transmission line of said second printed circuit board and the other terminal is electrically connected to said capacitive load conductor of said first printed circuit board, and further wherein said antenna body comprises a chip antenna body comprising a base made of at least one of a dielectric material and a magnetic material, at least one conductor provided at least on an external surface of said base or in an internal area of said base, and a pair of terminals provided on the external surface of said base and connected to both ends of said conductor.

2. An antenna device, comprising;

a first printed circuit board having a capacitive load conductor, a second printed circuit board having a ground electrode and a transmission line, one end of which is connected to a power source, a ground plate connected to said ground electrode, a plurality of antenna bodies each comprising a conductor having a pair of terminals on both ends, said first printed circuit board being arranged substantially in parallel with said ground plate, said second printed circuit board being arranged between said first printed circuit board and said ground plate such that said second printed circuit board is substantially perpendicular to both of said first printed circuit board and said ground plate, and said plurality of antenna bodies comprising a first antenna body comprising a feeding element in which one of said terminals is electrically connected to said transmission line of said second printed circuit board and the other terminal is electrically connected to said capacitive load conductor of said first printed circuit board, and further comprising a second antenna body, in which one of said terminals is electrically connected to said ground electrode and the other of said terminals is electrically connected to said capacitive load conductor of said first printed circuit board to which the other terminal of said feeding element is connected, and further wherein each of said antenna bodies comprises a chip antenna body comprising a base made of at least one of a dielectric material and a magnetic material, at least one conductor provided at least on an external surface of said base or in an internal area of said base, and a pair of terminals provided on the external surface of said base and connected to both ends of said conductor.

3. An antenna device, comprising:

a first printed circuit board having a capacitive load conductor, a second printed circuit board having a ground electrode and a transmission line, one end of which is connected to a power source, a ground plate connected to said ground electrode, a plurality of antenna bodies each comprising a conductor having a pair of terminals on both ends, said first printed circuit board being arranged substantially in parallel with said ground plate, said second printed circuit board being arranged between said first printed circuit board and said ground plate such that said second printed circuit board is substantially perpendicular to both of said first printed circuit board and said ground plate, and said plurality of antenna bodies comprising a first antenna body comprising a feeding element, in which one of said terminals is electrically connected to said transmission line of said second printed circuit board and the other terminal is electrically connected to said capacitive load conductor of said first printed circuit board, and further comprising a second antenna body, said second antenna body having one terminal electrically connected to said ground electrode and the other of said terminals electrically connected to said capacitive load conductor of said first printed circuit board to which the other terminal of said feeding element is connected and further wherein:

said first printed circuit board has at least two capacitive load conductors, and said plurality of antenna bodies further comprising a third antenna body comprising a non-feeding element, in which one of said terminals is electrically connected to said ground electrode of said second printed circuit board and the other of said terminals is electrically connected to one of said capacitive load conductors different from the capacitive load conductor to which the other terminal of said feeding element is connected, and further wherein each of said antenna bodies comprises a chip antenna body comprising a base made of at least one of a dielectric material and a magnetic material, at least one conductor provided at least on an external surface of said base or in an internal area of said base, and a pair of terminals provided on the external surface of said based and connected to both ends of said conductor.

4. An antenna device, comprising;

a first printed circuit board having a capacitive load conductor, a second printed circuit board having a ground electrode and a transmission line, one end of which is connected to a power source, a ground plate connected to said ground electrode, a plurality of antenna bodies each comprising a conductor having a pair of terminals on both ends, said first printed circuit board being arranged substantially in parallel with said ground plate, said second printed circuit board being arranged between said first printed circuit board and said ground plate such that said second printed circuit board is substantially vertical to both of said first printed circuit board and said ground plate, and said plurality of antenna bodies comprising a first antenna body comprising a feeding element in which one of said terminals is electrically connected to said transmission line of said second printed circuit board and the other terminal is electrically connected to said capacitive load conductor of said first printed circuit board, and further comprising said first printed circuit board has at least two capacitive load conductors, and said plurality of antenna bodies further comprising:

a second antenna body comprising a non-feeding element, in which one of said terminals is electrically connected to said ground electrode of said second printed circuit board and the other of said terminals is electrically connected to one of said capacitive load conductors different from the capacitive load conductor to which the other terminal of said feeding element is connected, and further wherein each of said antenna bodies comprising a chip antenna body comprising a base made of at least one of a dielectric material and a magnetic material, at least one conductor provided at least on an external surface of said base or in an internal area of said base, and a pair of terminals provided on the external surface of said base and connected to both ends of said conductor.

5. An antenna device according to claim 4, wherein said antenna body comprises a meandering-patterned electrode or a spiral-patterned electrode provided on said second printed circuit board.

6. An antenna device according to claim 3, wherein said antenna body comprises a meandering-patterned electrode or a spiral-patterned electrode provided on said second printed circuit board.

7. An antenna device according to claim 2, wherein said antenna body comprises a meandering-patterned electrode or a spiral-patterned electrode provided on said second printed circuit board.

8. An antenna device according to claim 1, wherein said antenna body comprises a meandering-patterned electrode or a spiral-patterned electrode provided on said second printed circuit board.

* * * * *